United States Patent
Kang (10) Patent No.: US 11,431,338 B1
(45) Date of Patent: Aug. 30, 2022

(54) SEMICONDUCTOR APPARATUS PERFORMING CALIBRATION OPERATION AND A SEMICONDUCTOR SYSTEM USING THE SEMICONDUCTOR APPARATUS

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/369,729

(22) Filed: Jul. 7, 2021

(30) Foreign Application Priority Data

Feb. 8, 2021 (KR) .................. 10-2021-0017243

(51) Int. Cl.
*H03K 19/00* (2006.01)
*G11C 7/10* (2006.01)

(52) U.S. Cl.
CPC ....... *H03K 19/0005* (2013.01); *G11C 7/1048* (2013.01); *G11C 2207/2254* (2013.01)

(58) Field of Classification Search
CPC .............. H03K 19/0005; G11C 7/1048; G11C 2207/2254
USPC ......................................................... 326/30
See application file for complete search history.

(56) References Cited

U.S. PATENT DOCUMENTS

| 9,118,313 | B2 | 8/2015 | Lee et al. | |
| 10,747,245 | B1* | 8/2020 | He | G11C 29/12005 |
| 10,917,093 | B1* | 2/2021 | He | G11C 7/1084 |
| 11,196,418 | B1* | 12/2021 | Suryanarayana | G11C 29/028 |
| 2010/0308861 | A1* | 12/2010 | Lee | H04L 25/0278 326/82 |
| 2011/0102073 | A1* | 5/2011 | Riho | H04L 25/0278 327/541 |
| 2011/0291699 | A1 | 12/2011 | Cho | |
| 2012/0099383 | A1* | 4/2012 | Kim | G11C 7/1057 365/189.05 |
| 2017/0162238 | A1* | 6/2017 | Lee | G11C 29/022 |
| 2017/0168746 | A1* | 6/2017 | Kwon | G11C 7/1057 |
| 2018/0053539 | A1* | 2/2018 | Shin | G11C 7/1084 |
| 2018/0114586 | A1* | 4/2018 | Jang | G11C 29/50008 |
| 2020/0058332 | A1* | 2/2020 | Choi | G11C 11/4082 |
| 2021/0149423 | A1* | 5/2021 | He | G11C 7/1084 |
| 2022/0076716 | A1* | 3/2022 | Um | G11C 7/1057 |

FOREIGN PATENT DOCUMENTS

KR 1020210036582 A 4/2021

* cited by examiner

*Primary Examiner* — Don P Le
(74) *Attorney, Agent, or Firm* — William Park & Associates Ltd.

(57) ABSTRACT

A semiconductor system includes a semiconductor apparatus and an external apparatus. The semiconductor apparatus includes a calibration code generating circuit, a code shifting circuit, and a main driver. The calibration code generating circuit performs a calibration operation to generate a calibration code. The code shifting circuit changes, based on a shifting control signal, a value of the calibration code. A resistance value of the main driver may be set on the basis of the calibration code and a shifted calibration code. The external apparatus generates the shifting control signal based on the resistance value of the main driver.

21 Claims, 6 Drawing Sheets

SEMICONDUCTOR APPARATUS PERFORMING CALIBRATION OPERATION AND A SEMICONDUCTOR SYSTEM USING THE SEMICONDUCTOR APPARATUS

CROSS-REFERENCES TO RELATED APPLICATION

The present application claims priority under 35 U.S.C. § 119(a) to Korean application number 10-2021-0017243, filed on Feb. 8, 2021, in the Korean Intellectual Property Office, which is incorporated herein by reference in its entirety as set forth in full.

BACKGROUND

1. Technical Field

Various embodiments generally relate to an integrated circuit technology and, more particularly, to a semiconductor apparatus and a semiconductor system.

2. Related Art

An electronic device includes a lot of electronic elements and a computer system as the electronic device includes lots of semiconductor apparatuses each configured by a semiconductor. Each of the semiconductor apparatuses configuring the computer system may be provided with a data transmission device to transmit data. As the operation speed of a semiconductor apparatus becomes greater and power consumption thereof becomes smaller, a signal transferred between semiconductor apparatuses may be distorted due to an external noise and impedance mismatching between the semiconductor apparatuses communicating with each other, Therefore, a semiconductor apparatus may perform an operation of matching the impedance or resistance of the data transmission device.

In general, a semiconductor apparatus may be provided with an on-die-termination circuit configured to perform an operation of matching impedance for precisely transferring a correct signal. Also, the semiconductor apparatus may correct, for exact impedance matching, a termination resistance according to process, voltage and temperature (PVT) variation. The semiconductor apparatus is to coupled to an external reference resistance and corrects the impedance value of the termination resistance by performing a calibration operation with the external reference resistance, which is generally referred to as a ZQ calibration operation.

SUMMARY

In an embodiment, a semiconductor apparatus may include a calibration code generating circuit, a code shifting circuit, a code selecting circuit, and a main driver. The calibration code generating circuit may be coupled to an external reference resistance and may be configured to perform a calibration operation to generate a calibration code. The code shifting circuit may be configured to change, based on a shifting control signal, a value of the calibration code to generate a shifted calibration code. The code selecting circuit may be configured to output one of the calibration code and the shifted calibration code as a first selection calibration code according to the operation mode, and output one of the calibration code and the shifted calibration code as a second selection calibration code according to the operation mode, A resistance value of the main driver may be set on the basis of the first selection calibration code and the second selection calibration code.

In an embodiment, a semiconductor apparatus may include a calibration code generating circuit, a code shifting circuit, a first code selecting circuit, a second code selecting circuit, and a main driver. The calibration code generating circuit may be coupled to an external reference resistance and may be configured to perform a calibration operation to generate a pull-up calibration code and a pull-down calibration code. The code shifting circuit may be configured to change, based on a shifting control signal, values of the pull-up calibration code and the pull-down calibration code to generate a shifted pull-up calibration code and a shifted pull-down calibration code. The first code selecting circuit may be configured to output, as a first selection pull-up calibration code, one of the pull-up calibration code and the shifted pull-up calibration code and configured to output, as a second selection pull-up calibration code, one of the pull-up calibration code and the shifted pull-up calibration code, according to an operation mode. The second code selecting circuit may be configured to output, as a first selection pull-down calibration code, one of the pull-down calibration code and the shifted pull-down calibration code and configured to output, as a second selection pull-down calibration code, one of the pull-down calibration code and the shifted pull-down calibration code, according to the operation mode, A pull-up resistance value of the main driver may be set on the basis of the first selection pull-up calibration code and the second selection pull-up calibration code. A pull-down resistance value of the main driver may be set on the basis of the first selection pull-down calibration code and the second selection pull-down calibration code.

In an embodiment, a semiconductor system may include a semiconductor apparatus and an external apparatus. The semiconductor apparatus may include a calibration code generating circuit, a code shifting circuit, and a main driver. The calibration code generating circuit may be coupled to an external reference resistance and may be configured to perform a calibration operation to generate a calibration code. The code shifting circuit may be configured to change, based on a shifting control signal, a value of the calibration code to generate a shifted calibration code. A resistance value of the main driver may be set on the basis of the calibration code and the shifted calibration code. The external apparatus may be configured to generate the shifting control signal based on the resistance value of the main driver.

DETAILED DESCRIPTION

Figure 1:
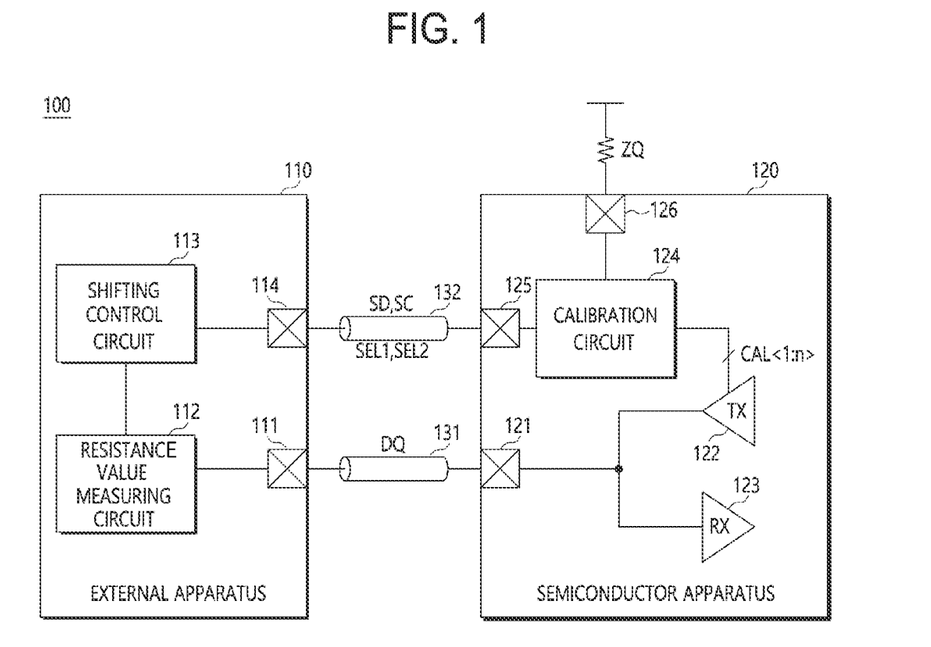
FIG. 1 is a diagram illustrating a configuration of a semiconductor system in accordance with an embodiment.

FIG. 1 is a diagram illustrating a configuration of a semiconductor system 100 in accordance with an embodiment. Referring to FIG. 1, the semiconductor system 100 in accordance with an embodiment may include an external apparatus 110 and a semiconductor apparatus 120. The external apparatus 110 and the semiconductor apparatus 120 may be electronic elements configured to communicate with each other. In an embodiment, the external apparatus 110 may be a master device and the semiconductor apparatus 120 may be a slave device configured to operate under the control of the external apparatus 110, For example, the external apparatus 110 may be a host device such as a processor or a controller and may include a central processing unit (CPU), a graphic processing unit (GPU), a multimedia processor (MMP), a digital signal processor, and a memory controller. Also, the external apparatus 110 may be fabricated in a form of a System on Chip (SoC) by combining processor chips (e.g., application processor (AP)) having various functions. Further, the external apparatus 110 may be a test device configured to test the performance of the semiconductor apparatus 120 and tune the operational parameters of the semiconductor apparatus 120. The semiconductor apparatus 120 may be a memory device and the memory device may include a volatile memory and a non-volatile memory. The volatile memory may include a static random access memory (static RAM: SRAM), a dynamic RAM (DRAM) and a synchronous DRAM (SDRAM), The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and so forth.

The external apparatus 110 and the semiconductor apparatus 120 may be coupled to each other through a first signal transmission line 131 and a second signal transmission line 132. The external apparatus 110 may include a pad 111 and may be coupled to the first signal transmission line 131 through the pad 111, The semiconductor apparatus 120 may include a pad 121 and may be coupled to the first signal transmission line 131 through the pad 121. The first signal transmission line 131 may be a channel, a link or a bus. The first signal transmission line 131 may be a bidirectional bus. For example the first signal transmission line 131 may be a data bus. The external apparatus 110 may include a pad 114 and may be coupled to the second signal transmission line 132 through the pad 114, The semiconductor apparatus 120 may include a pad 125 and may be coupled to the second signal transmission line 132 through the pad 125. The second signal transmission line 132 may be a unidirectional bus from the external apparatus 110 to the second semiconductor apparatus 120. For example, the second signal transmission line 132 may be a command address bus.

The semiconductor apparatus 120 may include a transmitting circuit (TX) 122 and a receiving circuit (RX) 123. The transmitting circuit 122 may transmit a signal, which is output from the semiconductor apparatus 120, to the external apparatus 110 through the first signal transmission line 131. The receiving circuit 123 may receive a signal transmitted from the external apparatus 110 through the first signal transmission line 131.

The semiconductor apparatus 120 may further include a calibration circuit 124. The calibration circuit 124 may be electrically coupled to an external reference resistance ZQ and may perform a calibration operation. The calibration circuit 124 may be coupled to the external reference resistance ZQ through a reference resistance pad 126. The calibration circuit 124 may perform the calibration operation to generate a calibration code CAL<1:n> ('n' is an integer of 2 or greater), The calibration circuit 124 may provide the transmitting circuit 122 with the calibration code CAL<1:n> to set a resistance value of the transmitting circuit 122. The calibration operation may be an operation of setting the resistance value of a main driver, which is included in the transmitting circuit 122, to become a resistance value corresponding to the extern& reference resistance ZQ. For example, the resistance value of the transmitting circuit 122 may be set to any one among 48 ohms, 60 ohms, 120 ohms, 240 ohms, and so forth according to a result of the calibration operation. The transmitting circuit 122 may have a pull-up resistance value and/or pull-up driving force for driving the first signal transmission line 131 to a logic high level. The transmitting circuit 122 may have a pull-down resistance value and/or pull-down driving force for driving the first signal transmission line 131 to a logic low level. Based on the calibration code CAL<1:n> of the calibration circuit 124, the pull-up resistance value and/or pull-up driving force and the pull-down resistance value and/or pull-down driving force of the transmitting circuit 122 may be set to correspond to the resistance value of the external reference resistance ZQ.

The external apparatus 110 may generate a shifting control signal based on the resistance value of the transmitting circuit 122 or the main driver, the resistance value being set through the calibration operation of the calibration circuit 124. The external apparatus 110 may compare a target resistance value with the resistance value of the transmitting circuit 122 or the main driver and may generate the shifting control signal according to a result of the comparison. The external apparatus 110 may include a resistance value measuring circuit 112 and a shifting control circuit 113. The resistance value measuring circuit 112 may be coupled to the first signal transmission line 131 through the pad 111 and may be coupled to the transmitting circuit 122 of the semiconductor apparatus 120 through the first signal transmission line 131. The resistance value measuring circuit 112 may measure the voltage level of the pad 121 and/or the first signal transmission line 131 to measure the resistance value of the transmitting circuit 122 or the main driver. The resistance value measuring circuit 112 may compare the voltage level of the first signal transmission line 131 with a voltage level defining the target resistance value to output a result of the comparison.

The shifting control circuit 113 may generate the shifting control signal based on the result of the comparison. The shifting control signal may include a direction control signal SD and a code value control signal SC. The direction control signal SD may include information on whether to increase or decrease a code value of the calibration code CAL<1:n>, which is generated through the calibration operation. The code value control signal SC may include information on an amount of the increase or decrease of the code value of the calibration code CAL<1:n>. The shifting control circuit 113 may be implemented as a Finite State Machine (FSM), Based on the result of the comparison, the shifting control circuit 113 may output the direction control signal SD and the code value control signal SC respectively having particular values. The shifting control circuit 113 may be coupled to the second signal transmission line 132 through the pad 114. The shifting control circuit 113 may provide the semiconductor apparatus 120 with the direction control signal SD and the code value control signal SC through the second signal transmission line 132. The shifting control circuit 113 may further generate a first selection signal SEL1 and a second selection signal SEL2 according to an operation mode. The operation mode may include a first operation mode, a second operation mode and a third operation mode. For example, in response to a user request, the shifting control circuit 113 may select one of the first to third operation modes. The first operation mode may be a default mode, the second operation mode may be an averaging mode and the third operation mode may be a tuning mode. The first to third operation modes will be described more later. According to the selected operation mode, the shifting control circuit 113 may change logic levels of the first selection signal SEA and the second selection signal SEL2. The first selection signal SEL1 and the second selection signal SEL2 may be provided to the semiconductor apparatus 120 through the second signal transmission line 132.

Figure 2:
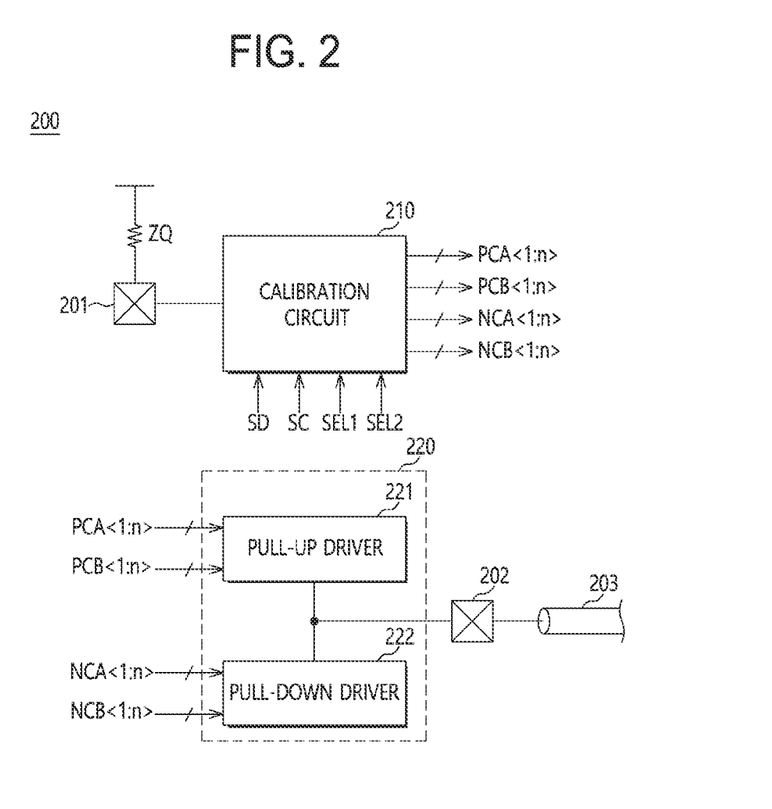
FIG. 2 is a diagram illustrating a configuration of a semiconductor apparatus in accordance with an embodiment.

The calibration circuit 124 of the semiconductor apparatus 120 may receive the shifting control signal through the first signal transmission line 131 and the pad 125. Based on the shifting control signal, the calibration circuit 124 may change the code value of the calibration code CAL<1:n>. Based on the direction control signal SD, the calibration circuit 124 may increase or decrease the code value of the calibration code CAL<1:n> by an amount specified by the code value control signal SC to generate a shifted calibration code, A resistance value of the transmitting circuit 122 may be set on the basis of the calibration code CAL<1:n> and the shifted calibration code, which are generated from the calibration circuit 124. The calibration circuit 124 may further receive the first selection signal SEL1 and the second selection signal SEL2 through the second signal transmission line 132. Based on the first selection signal SEL1 and the second selection signal SEL2, the calibration circuit 124 may provide the transmitting circuit 122 with one or more of the calibration code CAL<1:n> and the shifted calibration code, FIG. 2 is a diagram illustrating a configuration of a semiconductor apparatus 200 in accordance with an embodiment. The semiconductor apparatus 200 may be applied as the semiconductor apparatus 120 of FIG. 1. The semiconductor apparatus 200 may include a calibration circuit 210 and a main driver 220, The calibration circuit 210 may be applied as the calibration circuit 124 of FIG. 1 and the main driver 220 may be included in the transmitting circuit 122 of FIG. 1 as a part of a configuration of the transmitting circuit 122. The calibration circuit 210 may perform a calibration operation to generate a calibration code. The calibration circuit 210 may be coupled to the external reference resistance ZQ to perform the calibration operation. The calibration circuit 210 may be coupled to the external reference resistance ZQ through a reference resistance pad 201. The calibration operation that the calibration circuit 210 performs may be an operation of matching the resistance value of the main driver 220 to the resistance value of the external reference resistance ZQ.

The calibration circuit 210 may shift the calibration code to generate a shifted calibration code. Based on the shifting control signal, the calibration circuit 210 may change the code value of the calibration code to generate the shifted calibration code. The calibration code may include a pull-up calibration code and a pull-down calibration code. The calibration circuit 210 may shift the pull-up calibration code to generate a shifted pull-up calibration code. Based on the shifting control signal, the calibration circuit 210 may change the code value of the pull-up calibration code to generate the shifted pull-up calibration code. The calibration circuit 210 may receive the direction control signal SD and the code value control signal SC as the shifting control signal. Based on the direction control signal SD and the code value control signal SC, the calibration circuit 210 may change the code value of the pull-up calibration code to generate the shifted pull-up calibration code. Based on the direction control signal SD and the code value control signal SC, the calibration circuit 210 may shift the pull-down calibration code to generate a shifted pull-down calibration code.

Based on the calibration code and the shifted calibration code, the calibration circuit 210 may generate a first selection calibration code and a second selection calibration code. The calibration circuit 210 may generate a first selection pull-up calibration code PCA<1:n> and a second selection pull-up calibration code PCB<1:n> from the pull-up calibration code and the shifted pull-up calibration code. The calibration circuit 210 may output, as the first selection pull-up calibration code PCA<1:n>, one between the pull-up calibration code and the shifted pull-up calibration code and may output, as the second selection pull-up calibration code PCB<1:n>, one between the pull-up calibration code and the shifted pull-up calibration code. According to the operation mode, the calibration circuit 210 may select one between the pull-up calibration code and the shifted pull-up calibration code to output the selected calibration code as the first selection pull-up calibration code PCA<1:n> or the second selection pull-up calibration code PCB<1:n>. The calibration circuit 210 may receive the first selection signal SEL1 and the second selection signal SEL2 respectively having logic values that change according to the operation mode. Based on the first selection signal SEL1, the calibration circuit 210 may select one between the pull-up calibration code and the shifted pull-up calibration code and may output the selected calibration code as the first selection pull-up calibration code PCA<1:n>. Based on the second selection signal SEL2, the calibration circuit 210 may select one between the pull-up calibration code and the shifted calibration code and may output the selected calibration code as the second selection pull-up calibration code PCB<1:n>.

The calibration circuit 210 may generate a first selection pull-down calibration code NCA<1:n> and a second selection pull-down calibration code NCB<1:n> from the pull-down calibration code and the shifted pull-down calibration code. The calibration circuit 210 may output, as the first selection pull-down calibration code NCA<1:n>, one between the pull-down calibration code and the shifted pull-down calibration code and may output, as the second selection pull-down calibration code NCB<1:n>, one between the pull-down calibration code and the shifted pull-down calibration code. According to the operation mode, the calibration circuit 210 may select one between the pull-down calibration code and the shifted pull-down calibration code to output the selected calibration code as the first selection pull-down calibration code NCA<1:n> or the second selection pull-down calibration code NCB<1:n>. Based on the first selection signal SEL1, the calibration circuit 210 may select one between the pull-down calibration code and the shifted pull-down calibration code and may output the selected calibration code as the first selection pull-down calibration code NCA<1:n>. Based on the second selection signal SEL2, the calibration circuit 210 may select one between the pull-down calibration code and the shifted pull-down calibration code and may output the selected calibration code as the second selection pull-down calibration code NCB<1:n>.

The main driver 220 may receive the calibration code generated from the calibration circuit 210. A resistance value of the main driver 220 may be set on the basis of the calibration code generated from the calibration circuit 210. Based on the pull-up calibration code, a pull-up resistance value of the main driver 220 may be set. Based on the pull-down calibration code, a pull-down resistance value of the main driver 220 may be set. The pull-up resistance value of the main driver 220 may be set on the basis of the first selection pull-up calibration code PCA<1:n> and the second selection pull-up calibration code PCB<1:n>. The pull-down resistance value of the main driver 220 may be set on the basis of the first selection pull-down calibration code NCA<1:n> and the second selection pull-down calibration code NCB<1:n>.

Figure 3:
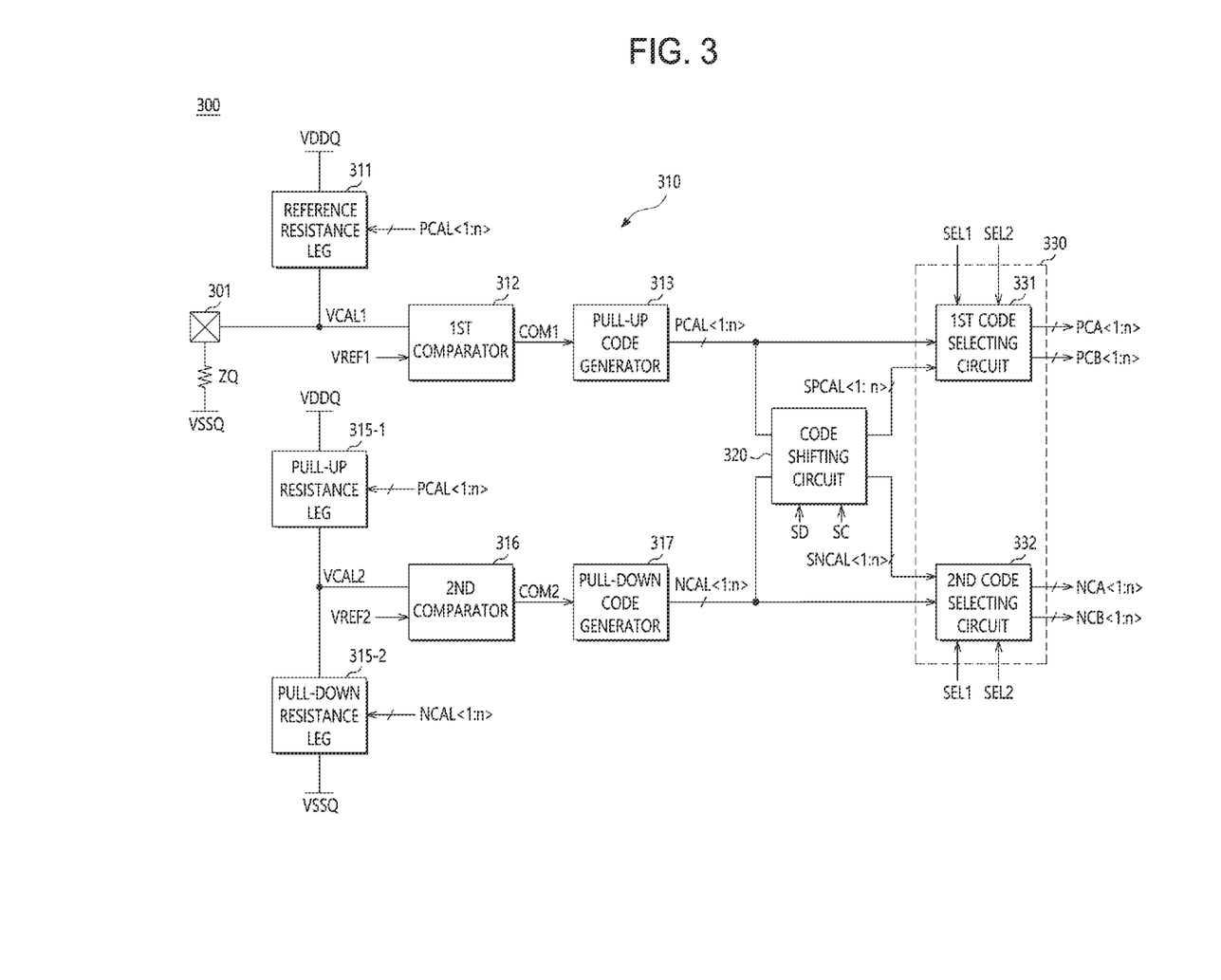
FIG. 3 is a diagram illustrating configurations of a calibration circuit in accordance with an embodiment.

The main driver 220 may include a pull-up driver 221 and a pull-down driver 222. The pull-up driver 221 may receive the first selection pull-up calibration code PCA<1:n> and the second selection pull-up calibration code PCB<1:n>. The resistance value of the pull-up driver 221 may be set on the basis of the first selection pull-up calibration code PCA<1:n> and the second selection pull-up calibration code PCB<1:n>. The pull-down driver 222 may receive the first selection pull-down calibration code NCA<1:n> and the second selection pull-down calibration code NCB<1:n>. The resistance value of the pull-down driver 222 may be set on the basis of the first selection pull-down calibration code NCA<1:n> and the second selection pull-down calibration code NCB<1:n>. The pull-up driver 221 and the pull-down driver 222 may be coupled to a pad 202 and may be coupled to a signal transmission line 203 through the pad 202, FIG. 3 is a diagram illustrating configurations of a calibration circuit 300 in accordance with an embodiment. The calibration circuit 300 may be applied as each of the calibration circuit 124 of FIG. 1 and the calibration circuit 210 of FIG. 2. Referring to FIG. 3, the calibration circuit 300 may include a calibration code generating circuit 310, a code shifting circuit 320 and a code selecting circuit 330. The calibration code generating circuit 310 may be coupled to the external reference resistance ZQ and may perform a calibration operation to generate a calibration code. The calibration code may include a pull-up calibration code PCAL<1:n> and a pull-down calibration code NCAL<1:n>.

The calibration code generating circuit 310 may include a reference resistance leg 311, a first comparator 312 and a pull-up code generator 313. The reference resistance leg 311 may be coupled to the external reference resistance ZQ through a reference resistance pad 301. The reference resistance leg 311 may be coupled between a node, to which a first power voltage VDDQ is supplied, and the reference resistance pad 301. The external reference resistance ZQ may be coupled between a node, to which a second power voltage VSSQ is supplied, and the reference resistance pad 301, The first power voltage VDDQ may have a higher voltage level than the second power voltage VSSQ, In an embodiment, the reference resistance leg 311 may be modified to be coupled between the node, to which the second power voltage VSSQ is supplied, and the reference resistance pad 301, In an embodiment, the external reference resistance ZQ may be modified to be coupled between the node, to which the first power voltage VDDQ is supplied, and the reference resistance pad 301. The reference resistance leg 311 may receive the pull-up calibration code PCAL<1:n>. A resistance value of the reference resistance leg 311 may be set on the basis of the pull-up calibration code PCAL<1:n>. The reference resistance leg 311 may be coupled to the external reference resistance ZQ and may generate a first calibration voltage VCAL1. A voltage level of the first calibration voltage VCAL1 may be determined according to a ratio between the resistance value of the reference resistance leg 311, which is set on the basis of the pull-up calibration code PCAL<1:n>, and the resistance value of the external reference resistance ZQ.

The first comparator 312 may receive the first calibration voltage VCAL1 and a first reference voltage VREF1. The first reference voltage VREF1 may have a voltage level corresponding to a target voltage level of the first calibration voltage VCAL1, For example, in order to set the resistance value of the reference resistance leg 311 to be the same as the resistance value of the external reference resistance ZQ, the target voltage level of the first calibration voltage VCAL1 may be an average value of the first power voltage VDDQ and the second power voltage VSSQ. The first reference voltage VREF1 may have the voltage level corresponding to the average value. The first comparator 312 may compare the first calibration voltage VCAL1 with the first reference voltage VREF1 to generate a first comparison signal COM1. When the first calibration voltage VCAL1 has a higher voltage level than the first reference voltage VREF1, the first comparator 312 may generate the first comparison signal COM1 having a first logic level. When the first calibration voltage VCAL1 has a lower voltage level than the first reference voltage VREF1, the first comparator 312 may generate the first comparison signal COM1 having a second logic level.

The pull-up code generator 313 may receive the first comparison signal COM1. The pull-up code generator 313 may generate the pull-up calibration code PCAL<1:n> based on the first comparison signal COM1. For example, when the first comparison signal COM1 has the first logic level, the pull-up code generator 313 may increase the code value of the pull-up calibration code PCAL<1:n> to increase the resistance value of the reference resistance leg 311. For example, when the first comparison signal COM1 has the second logic level, the pull-up code generator 313 may decrease the code value of the pull-up calibration code PCAL<1:n> to decrease the resistance value of the reference resistance leg 311.

The calibration code generating circuit 310 may further include a pull-up resistance leg 315-1, a pull-down resistance leg 315-2, a second comparator 316 and a pull-down code generator 317. The pull-up resistance leg 315-1 may receive the pull-up calibration code PCAL<1:n>. A resistance value of the pull-up resistance leg 315-1 may be set on the basis of the pull-up calibration code PCAL<1:n>. The pull-up resistance leg 315-1 may be designed as a replica of the reference resistance leg 311 and may have substantially the same configuration as the reference resistance leg 311. The pull-up resistance leg 315-1 may be coupled to the node, to which the first power voltage VDDQ is supplied. The pull-down resistance leg 315-2 may be coupled between the node, to which the second power voltage VSSQ is supplied, and the pull-up resistance leg 315-1. The pull-down resistance leg 315-2 may receive the pull-down calibration code NCAL<1:n>. A resistance value of the pull-down resistance leg 315-2 may be set on the basis of the pull-down calibration code NCAL<1:n>. The pull-down resistance leg 315-2 may be coupled to the pull-up resistance leg 315-1 and may generate a second calibration voltage VCAL2. A voltage level of the second calibration voltage VCAL2 may be determined according to a ratio between the resistance value of the pull-up resistance leg 315-1 and the resistance value of the pull-down resistance leg 315-2.

The second comparator 316 may receive the second calibration voltage VCAL2 and a second reference voltage VREF2. The second reference voltage VREF2 may have a voltage level corresponding to a target voltage level of the second calibration voltage VCAL2, The second reference voltage VREF2 may have substantially the same voltage level as the first reference voltage VREF1. In an embodiment, the second reference voltage VREF2 may have a different voltage level from the first reference voltage VREF1. For example, in order to set the resistance values of the pull-up driver 221 and the pull-down driver 222 differently according to a channel characteristic of the signal transmission line 203 coupled to the main driver 220 of FIG. 2, the second reference voltage VREF2 may have a different voltage level from the first reference voltage VREF1, The second comparator 316 may compare the second calibration voltage VCAL2 with the second reference voltage VREF2 to generate a second comparison signal COM2. When the second calibration voltage VCAL2 has a higher voltage level than the second reference voltage VREF2, the second comparator 316 may generate the second comparison signal COM2 having a first logic level. When the second calibration voltage VCAL2 has a lower voltage level than the second reference voltage VREF2, the second comparator 316 may generate the second comparison signal COM2 having a second logic level.

The pull-down code generator 317 may receive the second comparison signal COM2. The pull-down code generator 317 may generate the pull-down calibration code NCAL<1:n> based on the second comparison signal COM2, For example, when the second comparison signal COM2 has the first logic level, the pull-down code generator 317 may increase the code value of the pull-down calibration code NCAL<1:n> to decrease the resistance value of the pull-down resistance leg 315-2, For example, when the second comparison signal COM2 has the second logic level, the pull-down code generator 317 may decrease the code value of the pull-down calibration code NCAL<1:n> to increase the resistance value of the pull-down resistance leg 315-2.

The code shifting circuit 320 may receive the pull-up calibration code PCAL<1:n> and the pull-down calibration code NCAL<1:n> from the calibration code generating circuit 310. The code shifting circuit 320 may receive the shifting control signal. Based on the shifting control signal, the code shifting circuit 320 may change the code values of the pull-up calibration code PCAL<1:n> and the pull-down calibration code NCAL<1:n> to generate a shifted pull-up calibration code SPCAL<1:n> and a shifted pull-down calibration code SNCAL<1:n>. The code shifting circuit 320 may receive the direction control signal SD and the code value control signal SC as the shifting control signal. Based on the direction control signal SD, the code shifting circuit 320 may increase or decrease the code value of the pull-up calibration code PCAL<1:n> by an amount specified by the code value control signal SC to generate the shifted pull-up calibration code SPCAL<1:n>. For example, when the direction control signal SD has a first logic level, the code shifting circuit 320 may increase the code value of the pull-up calibration code PCAL<1:n> by the amount specified by the code value control signal SC to generate the shifted pull-up calibration code SPCAL<1:n> having the greater code value than the pull-up calibration code PCAL<1:n>. For example, when the direction control signal SD has a second logic level, the code shifting circuit 320 may decrease the code value of the pull-up calibration code PCAL<1:n> by the amount specified by the code value control signal SC to generate the shifted pull-up calibration code SPCAL<1:n> having the smaller code value than the pull-up calibration code PCAL<1:n>. Based on the direction control signal SD, the code shifting circuit 320 may increase or decrease the code value of the pull-down calibration code NCAL<1:n> by the amount specified by the code value control signal SC to generate the shifted pull-down calibration code SNCAL<1:n>. For example, when the direction control signal SD has a first logic level, the code shifting circuit 320 may increase the code value of the pull-down calibration code NCAL<1:n> by the amount specified by the code value control signal SC to generate the shifted pull-down calibration code SNCAL<1:n> having the greater code value than the pull-down calibration code NCAL<1:n>. For example, when the direction control signal SD has a second logic level, the code shifting circuit 320 may decrease the code value of the pull-down calibration code NCAL<1:n> by the amount specified by the code value control signal SC to generate the shifted pull-down calibration code SNCAL<1:n> having the smaller code value than the pull-down calibration code NCAL<1:n>. In an embodiment, the shifting control circuit 113 of FIG. 1 may generate a single direction control signal SD and a single code value control signal SC and the code shifting circuit 320 may shift the pull-up calibration code PCAL<1:n> and the pull-down calibration code NCAL<1:n> based on the same direction control signal SD and the same code value control signal SC. In an embodiment, the shifting control circuit 113 may independently generate the direction control signal SD and the code value control signal SC for shifting the pull-up calibration code PCAL<1:n> and may independently generate the direction control signal SD and the code value control signal SC for shifting the pull-down calibration code NCAL<1:n>, and the code shifting circuit 320 may differently shift the pull-up calibration code PCAL<1:n> and the pull-down calibration code NCAL<1:n> based on the different direction control signals SD and the different code value control signal SC.

The code selecting circuit 330 may receive the pull-up calibration code PCAL<1:n> and the shifted pull-up calibration code SPCAL<1:n>, According to the operation mode, the code selecting circuit 330 may generate the first selection pull-up calibration code PCA<1:n> and the second selection pull-up calibration code PCB<1:n> from the pull-up calibration code PCAL<1:n> and the shifted pull-up calibration code SPCAL<1:n>. The code selecting circuit 330 may receive the pull-down calibration code NCAL<1:n> and the shifted pull-down calibration code SNCAL<1:n>. According to the operation mode, the code selecting circuit 330 may generate the first selection pull-down calibration code NCA<1:n> and the second selection pull-down calibration code NCB<1:n> from the pull-down calibration code NCAL<1:n> and the shifted pull-down calibration code SNCAL<1:n>. The code selecting circuit 330 may receive the first selection signal SEL1 and the second selection signal SEL2 respectively having logic values that change according to the operation mode.

The code selecting circuit 330 may include a first code selecting circuit 331 and a second code selecting circuit 332. The first code selecting circuit 331 may receive the first selection signal SEM the second selection signal SEL2, the pull-up calibration code PCAL<1:n> and the shifted pull-up calibration code SPCAL<1:n>. Based on the first selection signal SEL1, the first code selecting circuit 331 may output, as the first selection pull-up calibration code PCA<1:n>, one between the pull-up calibration code PCAL<1:n> and the shifted pull-up calibration code SPCAL<1:n>. Based on the second selection signal SEL2, the first code selecting circuit 331 may output, as the second selection pull-up calibration code PCB<1:n>, one between the pull-up calibration code PCAL<1:n> and the shifted pull-up calibration code SPCAL<1:n>. The first operation mode may be the default mode. In the first operation mode, the first code selecting circuit 331 may output the pull-up calibration code PCAL<1:n> as the first selection pull-up calibration code PCA<1:n> and the second selection pull-up calibration code PCB<1:n> based on the first selection signal SEL1 and the second selection signal SEL2. The second operation mode may be the averaging mode. In the second operation mode, the first code selecting circuit 331 may output the pull-up calibration code PCAL<1:n> as one between the first selection pull-up calibration code PCA<1:n> and the second selection pull-up calibration code PCB<1:n> and may output the shifted pull-up calibration code SPCAL<1:n> as the other one between the first selection pull-up calibration code PCA<1:n> and the second selection pull-up calibration code PCB<1:n>, based on the first selection signal SEL1 and the second selection signal SEL2. The third operation mode may be the tuning mode. In the third operation mode, the first code selecting circuit 331 may output the shifted pull-up calibration code SPCAL<1:n> as the first selection pull-up calibration code PCA<1:n> and the second selection pull-up calibration code PCB<1:n> based on the first selection signal SEL1 and the second selection signal SEL2.

Figure 4:
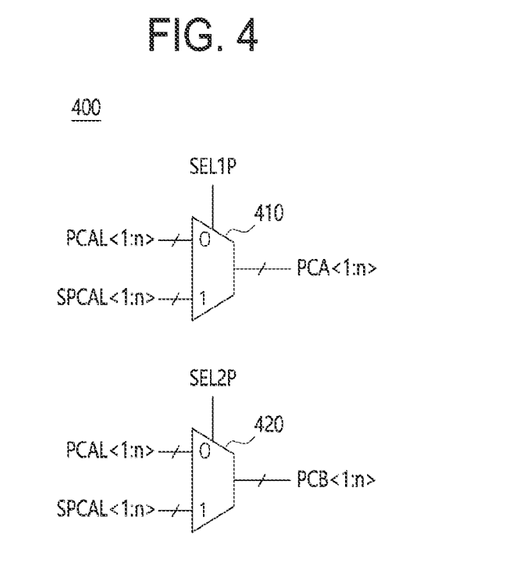
FIG. 4 is a diagram illustrating a configuration of a first code selecting circuit in accordance with an embodiment.

The second code selecting circuit 332 may receive the first selection signal SEL1, the second selection signal SEL2, the pull-down calibration code NCAL<1:n> and the shifted pull-down calibration code SNCAL<1:n>. Based on the first selection signal SEL1, the second code selecting circuit 332 may output, as the first selection pull-down calibration code NCA<1:n>, one between the pull-down calibration code NCAL<1:n> and the shifted pull-down calibration code SNCAL<1:n>. Based on the second selection signal SEL2, the second code selecting circuit 332 may output, as the second selection pull-down calibration code NCB<1:n>, one between the pull-down calibration code NCAL<1:n> and the shifted pull-down calibration code SNCAL<1:n>. In the first operation mode, the second code selecting circuit 332 may output the pull-down calibration code NCAL<1:n> as the first selection pull-down calibration code NCA<1:n> and the second selection pull-down calibration code NCB<1:n> based on the first selection signal SEL1 and the second selection signal SEL2. In the second operation mode, the second code selecting circuit 332 may output the pull-down calibration code NCAL<1:n> as one between the first selection pull-down calibration code NCA<1:n> and the second selection pull-down calibration code NCB<1:n> and may output the shifted pull-down calibration code SNCAL<1:n> as the other one between the first selection pull-down calibration code NCA<1:n> and the second selection pull-down calibration code NCB<1:n>, based on the first selection signal SEL1 and the second selection signal SEL2. In the third operation mode, the second code selecting circuit 332 may output the shifted pull-down calibration code SNCAL<1:n> as the first selection pull-down calibration code NCA<1:n> and the second selection pull-down calibration code NCB<1:n> based on the first selection signal SEL1 and the second selection signal SEL2. In an embodiment, the shifting control circuit 113 of FIG. 1 may generate a single first selection signal SEL1 and a single second selection signal SEL2, and the first code selecting circuit 331 and the second code selecting circuit 332 may select one between the pull-up calibration code PCAL<1:n> and the shifted pull-up calibration code SPCAL<1:n> and may select one between the pull-down calibration code NCAL<1:n> and the shifted pull-down calibration code SNCAL<1:n>, based on the same first selection signal SEL1 and the same second selection signal SEL2. In an embodiment, the shifting control circuit 113 may independently generate the first selection signal SEL1 and the second selection signal SEL2 for controlling the first code selecting circuit 331 and may independently generate the first selection signal SEL1 and the second selection signal SEL2 for controlling the second code selecting circuit 332, FIG. 4 is a diagram illustrating a configuration of a first code selecting circuit 400 in accordance with an embodiment. The first code selecting circuit 400 may be applied as the first code selecting circuit 331 of FIG. 3. Referring to FIG. 4, the first code selecting circuit 400 may include a first selection circuit 410 and a second selection circuit 420. Based on a first selection signal SEL1P, the first selection circuit 410 may output, as the first selection pull-up calibration code PCA<1:n>, one between the pull-up calibration code PCAL<1:n> and the shifted pull-up calibration code SPCAL<1:n>. When the first selection signal SEL1P has a logic low level, the first selection circuit 410 may output the pull-up calibration code PCAL<1:n> as the first selection pull-up calibration code PCA<1:n>, When the first selection signal SEL1P has a logic high level, the first selection circuit 410 may output the shifted pull-up calibration code SPCAL<1:n> as the first selection pull-up calibration code PCA<1:n>. Based on a second selection signal SEL2P, the second selection circuit 420 may output, as the second selection pull-up calibration code PCB<1:n>, one between the pull-up calibration code PCAL<1:n> and the shifted pull-up calibration code SPCAL<1:n>. When the second selection signal SEL2P has a logic low level, the second selection circuit 420 may output the pull-up calibration code PCAL<1:n> as the second selection pull-up calibration code PCB<1:n>. When the second selection signal SEL2P has a logic high level, the second selection circuit 420 may output the shifted pull-up calibration code SPCAL<1:n> as the second selection pull-up calibration code PCB<1:n>.

Figure 5:
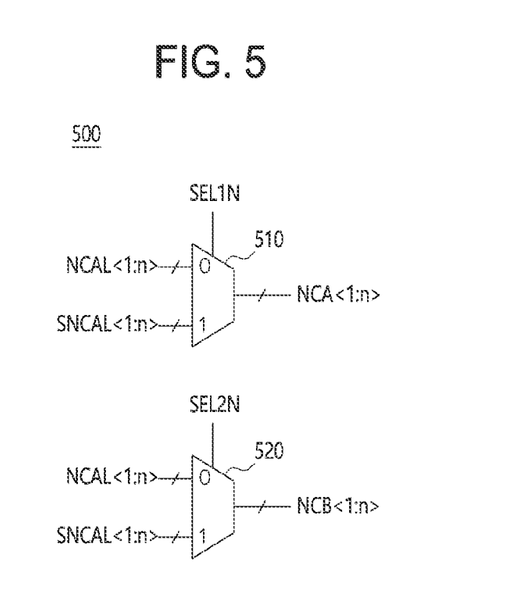
FIG. 5 is a diagram illustrating a configuration of a second code selecting circuit in accordance with an embodiment.

FIG. 5 is a diagram illustrating a configuration of a second code selecting circuit 500 in accordance with an embodiment. The second code selecting circuit 500 may be applied as the second code selecting circuit 332 of FIG. 3. Referring to FIG. 5, the second code selecting circuit 500 may include a first selection circuit 510 and a second selection circuit 520. Based on the first selection signal SEL1N, the first selection circuit 510 may output, as the first selection pull-down calibration code NCA<1:n>, one between the pull-down calibration code NCAL<1:n> and the shifted pull-down calibration code SNCAL<1:n>. When the first selection signal SHAN has a logic low level, the first selection circuit 510 may output the pull-down calibration code NCAL<1:n> as the first selection pull-down calibration code NCA<1:n>. When the first selection signal SEL1N has a logic high level, the first selection circuit 510 may output the shifted pull-down calibration code SNCAL<1:n> as the first selection pull-down calibration code NCA<1:n>. Based on the second selection signal SEL2N, the second selection circuit 520 may output, as the second selection pull-down calibration code NCB<1:n>, one between the pull-down calibration code NCAL<1:n> and the shifted pull-down calibration code SNCAL<1:n>. When the second selection signal SEL2N has a logic low level, the second selection circuit 520 may output the pull-down calibration code NCAL<1:n> as the second selection pull-down calibration code NCB<1:n>. When the second selection signal SEL2N has a logic high level, the second selection circuit 520 may output the shifted pull-down calibration code SNCAL<1:n> as the second selection pull-down calibration code NCB<1:n>.

Figure 6:
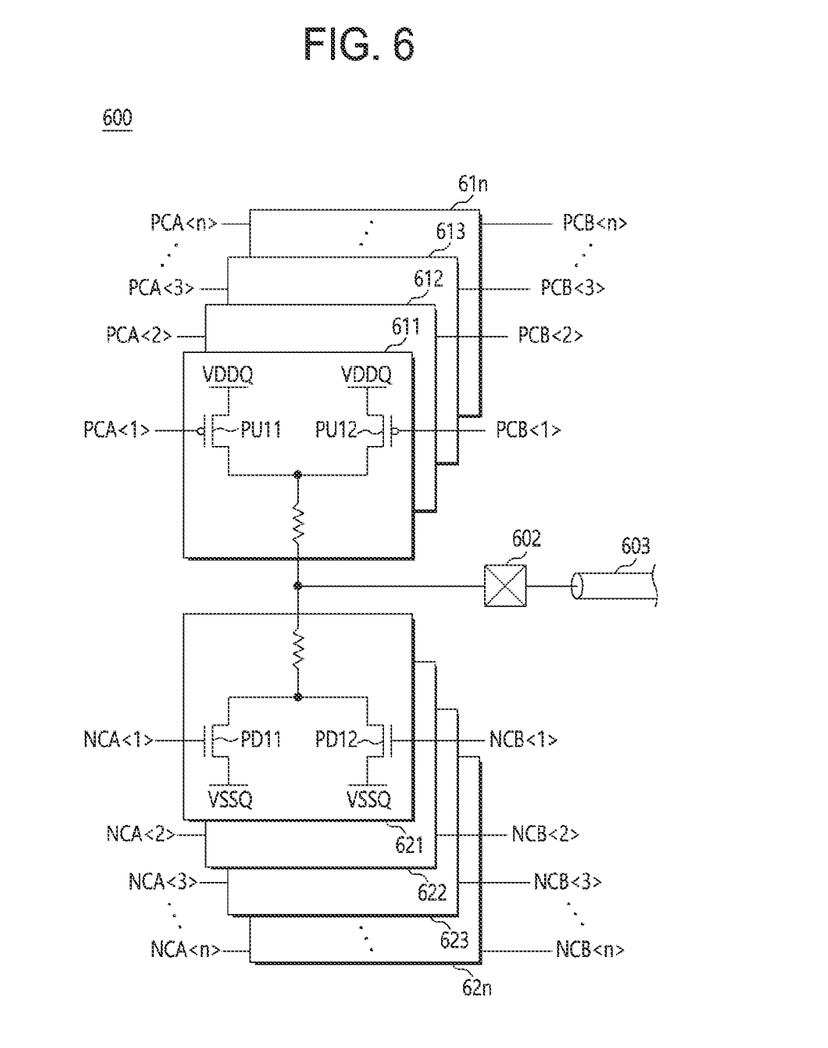
FIG. 6 is a diagram illustrating a configuration of a main driver in accordance with an embodiment.

FIG. 6 is a diagram illustrating a configuration of a main driver 600 in accordance with an embodiment. Referring to FIG. 6, the main driver 600 may receive the first selection calibration code and the second selection calibration code. The resistance value of the main driver 600 may be set on the basis of the first selection calibration code and the second selection calibration code. The main driver 600 may be coupled to the signal transmission line 603 through a pad 602 and may set the impedance of the signal transmission line 603. The main driver 600 may include a plurality of pull-up drivers 611, 612, 613 and 61$n$ and a plurality of pull-down drivers 621, 622, 623 and 62$n$. A number of the plurality of pull-up drivers 611, 612, 613 and 61$n$ may correspond to a number of bits of each of the first selection pull-up calibration code PCA<1:n> and the second selection pull-up calibration code PCB<1:n>. A number of the plurality of pull-down drivers 621, 622, 623 and 62$n$ may correspond to a number of bits of each of the first selection pull-down calibration code NCA<1:n> and the second selection pull-down calibration code NCB<1:n>. The plurality of pull-up drivers 611, 612, 613 and 61$n$ may be coupled between the node, to which the first power voltage VDDQ is supplied, and the pad 602, The pad 602 may be coupled to the signal transmission line 603, The plurality of pull-down drivers 621, 622, 623 and 62$n$ may be coupled between the node, to which the second power voltage VSSQ is supplied, and the pad 602. The plurality of pull-up drivers 611, 612, 613 and 61$n$ may receive the first selection pull-up calibration code PCA<1:n> and the second selection pull-up calibration code PCB<1:n>. The resistance values of the plurality of pull-up drivers 611, 612, 613 and 61$n$ may be set on the basis of the first selection pull-up calibration code PCA<1:n> and the second selection pull-up calibration code PCB<1:n>, The plurality of pull-down drivers 621, 622, 623 and 62$n$ may receive the first selection pull-down calibration code NCA<1:n> and the second selection pull-down calibration code NCB<1:n>. The resistance values of the plurality of pull-down drivers 621, 622, 623 and 62$n$ may be set on the basis of the first selection pull-down calibration code NCA<1:n> and the second selection pull-down calibration code NCB<1:n>.

The first pull-up driver 611 may receive the first bits PCA<1> and PCB<1> of the first selection pull-up calibration code PCA<1:n> and the second selection pull-up calibration code PCB<1:n>. The resistance value of the first pull-up driver 611 may be set on the basis of the first bits PCA<1> and PCB<1> of the first selection pull-up calibration code PCA<1:n> and the second selection pull-up calibration code PCB<1:n>. The second pull-up driver 612 may receive the second bits PCA<2> and PCB<2> of the first selection pull-up calibration code PCA<1:n> and the second selection pull-up calibration code PCB<1:n>. The resistance value of the second pull-up driver 612 may be set on the basis of the second bits PCA<2> and PCB<2> of the first selection pull-up calibration code PCA<1:n> and the second selection pull-up calibration code PCB<1:n>, The third pull-up driver 613 may receive the third bits PCA<3> and PCB<3> of the first selection pull-up calibration code PCA<1:n> and the second selection pull-up calibration code PCB<1:n>. The resistance value of the third pull-up driver 613 may be set on the basis of the third bits PCA<3> and PCB<3> of the first selection pull-up calibration code PCA<1:n> and the second selection pull-up calibration code PCB<1:n>. The n-th pull-up driver 61$n$ may receive the n-th bits PCA<n> and PCB<n> of the first selection pull-up calibration code PCA<1:n> and the second selection pull-up calibration code PCB<1:n>. The resistance value of the n-th driver 61$n$ may be set on the basis of the n-th bits PCA<n> and PCB<n> of the first selection pull-up calibration code PCA<1:n> and the second selection pull-up calibration code PCB<1:n>. The first pull-down driver 621 may receive the first bits NCA<1> and NCB<1> of the first selection pull-down calibration code NCA<1:n> and the second selection pull-down calibration code NCB<1:n>. The resistance value of the first pull-down driver 621 may be set on the basis of the first bits NCA<1> and NCB<1> of the first selection pull-down calibration code NCA<1:n> and the second selection pull-down calibration code NCB<1:n>. The second pull-down driver 622 may receive the second bits NCA<2> and NCB<2> of the first selection pull-down calibration code NCA<1:n> and the second selection pull-down calibration code NCB<1:n>. The resistance value of the second pull-down driver 622 may be set on the basis of the second bits NCA<2> and NCB<2> of the first selection pull-down calibration code NCA<1:n> and the second selection pull-down calibration code NCB<1:n>. The third pull-down driver 623 may receive the third bits NCA<3> and NCB<3> of the first selection pull-down calibration code NCA<1:n> and the second selection pull-down calibration code NCB<1:n>, The resistance value of the third pull-down driver 623 may be set on the basis of the third bits NCA<3> and NCB<3> of the first selection pull-down calibration code NCA<1:n> and the second selection pull-down calibration code NCB<1:n>. The n-th pull-down driver 62$n$ may receive the n-th bits NCA<n> and NCB<n> of the first selection pull-down calibration code NCA<1:n> and the second selection pull-down calibration code NCB<1:n>. The resistance value of the n-th pull-down driver 62$n$ may be set on the basis of the n-th bits NCA<n> and NCB<n> of the first selection pull-down calibration code NCA<1:n> and the second selection pull-down calibration code NCB<1:n>.

The first pull-up driver 611 may include a first pull-up transistor PU11 and a second pull-up transistor PU12. Each of the first pull-up transistor PU11 and the second pull-up transistor PU12 may be a P-channel MOS transistor. The first pull-up transistor PU11 and the second pull-up transistor PU12 may have the same size and the same width-to-length ratio. The first pull-up transistor PU11 may be coupled between the node, to which the first power voltage VDDQ is supplied, and the pad 602. The first pull-up transistor PU11 may receive the first bit PCA<1> of the first selection pull-up calibration code PCA<1:n> at its gate. The second pull-up transistor PU12 may be coupled in parallel to the first pull-up transistor PU11, The second pull-up transistor PU12 may be coupled between the node, to which the first power voltage VDDQ is supplied, and the pad 602. The second pull-up transistor PU12 may receive the first bit PCB<1> of the second selection pull-up calibration code PCB<1:n> at its gate, Each of the second to n-th pull-up drivers 612, 613 and 61$n$ may have the same configuration as the first pull-up driver 611 except that it receives other bits PCA<2:n> and PCB<2:n> of the first selection pull-up calibration code PCA<1:n> and the second selection pull-up calibration code PCB<1:n>.

The first pull-down driver 621 may include a first pull-down transistor PD11 and a second pull-down transistor PD12. Each of the first pull-down transistor PD11 and the second pull-down transistor PD12 may be a N-channel MOS transistor. The first pull-down transistor PD11 and the second pull-down transistor PD12 may have the same size and the same width-to-length ratio. The first pull-down transistor PD11 and the second pull-down transistor PD12 may be serially coupled to the first pull-up transistor PU11 and the second pull-up transistor PU12. The first pull-down transistor PD11 may be coupled between the node, to which the second power voltage VSSQ is supplied, and the pad 602, The first pull-down transistor PD11 may receive the first bit NCA<1> of the first selection pull-down calibration code NCA<1:n> at its gate. The second pull-down transistor PD12 may be coupled in parallel to the first pull-down transistor PD11. The second pull-down transistor PD12 may be coupled between the node, to which the second power voltage VSSQ is supplied, and the pad 602, The second pull-down transistor PD12 may receive the first bit NCB<1> of the second selection pull-down calibration code NCB<1:n> at its gate. Each of the second to n-th pull-down drivers 622, 623 and 62n may have the same configuration as the first pull-down driver 621 except that it receives other bits NCA<2:n> and NCB<2:n> of the first selection pull-down calibration code NCA<1:n> and the second selection pull-down calibration code NCB<1:n>.

TABLE 1

| Operation mode | SEL1 | SEL2 | PCA/NCA | PCB/NCB |
|---|---|---|---|---|
| Default mode | 0 | 0 | PCAL/NCAL | PCAL/NCAL |
| Averaging mode | 0 | 1 | PCAL/NCAL | SPCAL/SNCAL |
|  | 1 | 0 | SPCAL/SNCAL | PCAL/NCAL |
| Tuning mode | 1 | 1 | SPCAL/SNCAL | SPCAL/SNCAL |

Referring to table 1 and FIGS. 3 and 6, the first operation mode may be the default mode, in which the shifted calibration code is not utilized. In the first operation mode, the resistance value of the main driver 600 may be set on the basis of the calibration code. The resistance values of the plurality of pull-up drivers 611 to 61n may be set on the basis of the pull-up calibration code PCAL<1:n>. The resistance values of the plurality of pull-down drivers 621 to 62n may be set on the basis of the pull-down calibration code NCAL<1:n>. In the default mode, both of the first selection signal SEL1 and the second selection signal SEL2 may have a logic low level. When both of the first selection signal SEL1 and the second selection signal SEL2 have a logic low level, the first code selecting circuit 331 may output the pull-up calibration code PCAL<1:n> as the first selection pull-up calibration code PCA<1:n> and the second selection pull-up calibration code PCB<1:n> and the second code selecting circuit 332 may output the pull-down calibration code NCAL<1:n> as the first selection pull-down calibration code NCA<1:n> and the second selection pull-down calibration code NCB<1:n>.

The second operation mode may be the averaging mode, in which both of the calibration code and the shifted calibration code are utilized. In the second operation mode, the resistance value of the main driver 600 may be set on the basis of the calibration code and the shifted calibration code. The resistance values of the plurality of pull-up drivers 611 to 61n may be set on the basis of the pull-up calibration code PCAL<1:n> and the shifted pull-up calibration code SPCAL<1:n>, The resistance values of the plurality of pull-down drivers 621 to 62n may be set on the basis of the pull-down calibration code NCAL<1:n> and the shifted pull-down calibration code SNCAL<1:n>. In the averaging mode, one may have a logic low level and the other one may have a logic high level between the first selection signal SEL1 and the second selection signal SEL2. The first code selecting circuit 331 may output the pull-up calibration code PCAL<1:n> as one between the first selection pull-up calibration code PCA<1:n> and the second selection pull-up calibration code PCB<1:n> and may output the shifted pull-up calibration code SPCAL<1:n> as the other one between the first selection pull-up calibration code PCA<1:n> and the second selection pull-up calibration code PCB<1:n>, The second code selecting circuit 332 may output the pull-down calibration code NCAL<1:n> as one between the first selection pull-down calibration code NCA<1:n> and the second selection pull-down calibration code NCB<1:n> and may output the shifted pull-down calibration code SNCAL<1:n> as the other one between the first selection pull-down calibration code NCA<1:n> and the second selection pull-down calibration code NCB<1:n>.

The third operation mode may be the tuning mode, in which only the shifted calibration code is utilized. The tuning mode may be an operation mode, in which a user customizes the resistance value of the main driver 600. In the third operation mode, the resistance value of the main driver 600 may be set on the basis of the shifted calibration code. The resistance values of the plurality of pull-up drivers 611 to 61n may be set on the basis of the shifted pull-up calibration code SPCAL<1:n>. The resistance values of the plurality of pull-down drivers 621 to 62n may be set on the basis of the shifted pull-down calibration code SNCAL<1:n>. In the third operation mode, both of the first selection signal SEL1 and the second selection signal SEL2 may have a logic high level. When both of the first selection signal SEL1 and the second selection signal SEL2 have a logic high level, the first code selecting circuit 331 may output the shifted pull-up calibration code SPCAL<1:n> as the first selection pull-up calibration code PCA<1:n> and the second selection pull-up calibration code PCB<1:n> and the second code selecting circuit 332 may output the shifted pull-down calibration code SNCAL<1:n> as the first selection pull-down calibration code NCA<1:n> and the second selection pull-down calibration code NCB<1:n>.

Figure 7:
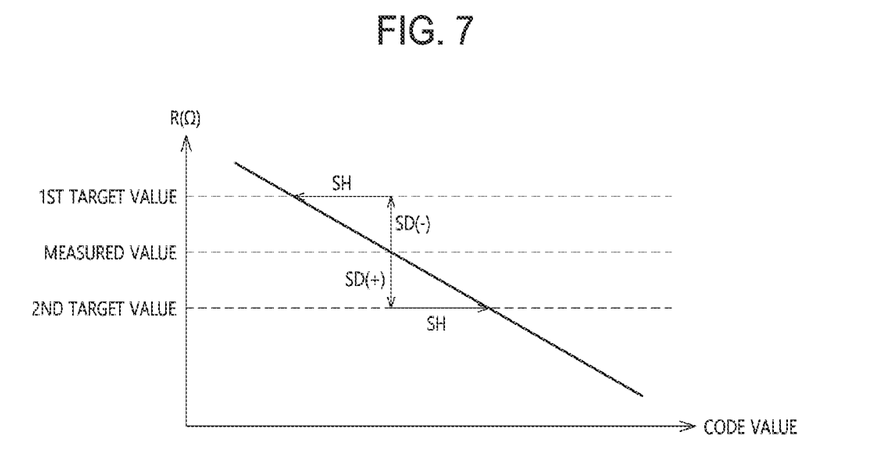
FIG. 7 is a diagram illustrating operations of a semiconductor apparatus and a semiconductor system in accordance with an embodiment.
Figure 8:
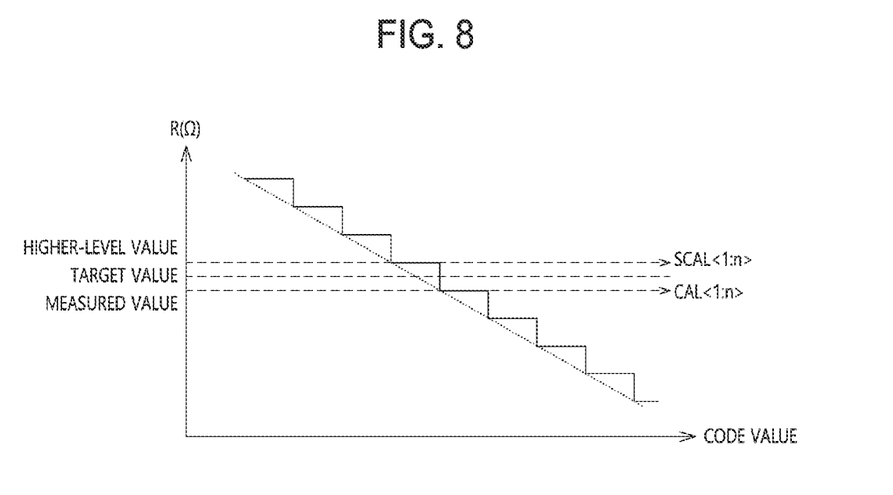
FIG. 8 is a diagram illustrating operations of a semiconductor apparatus and a semiconductor system in accordance with an embodiment.

FIGS. 7 and 8 are diagrams illustrating operations of a semiconductor apparatus and a semiconductor system in accordance with an embodiment. Each graph illustrated in FIGS. 7 and 8 has the x-axis representing a code value and the y-axis representing a resistance (R) value in units of ohms (Ω), As the code value increases, the resistance value may decrease. Hereinafter, described with reference to FIGS. 1, 3, 6, 7 and 8 will be the operations of the semiconductor apparatus 120 and the semiconductor system 100 in accordance with an embodiment. Within the semiconductor apparatus 120, the calibration circuit 124 or the calibration circuit 300 may be coupled to the external reference resistance ZQ and may perform a calibration operation to generate the calibration code CAL<1:n>. Within the transmitting circuit 122, the resistance value of the main driver 600 may be set on the basis of the calibration code CAL<1:n>, When the resistance value of the main driver 600 is set, the resistance value measuring circuit 112 of the external apparatus 110 may measure the resistance value of the main driver 600 through the first signal transmission line 131. The resistance value measuring circuit 112 may compare the target resistance value with the resistance value of the main driver 600. For example, when the target resistance value is a first target value, the resistance value measuring circuit 112 may detect that the measured value is smaller than the first target value and may provide the shifting control circuit 113 with a result of the detection. The shifting control circuit 113 may generate the direction control signal SD and the code value control signal SC for decreasing the code value of the calibration code. In order to decrease the code value of the calibration code, the shifting control circuit 113 may generate a negative direction control signal SD(−). For example, the negative direction control signal SD(−) may have a logic low level. In order for the measured value to become close to the first target value, the shifting control circuit 113 may generate the code value control signal SC corresponding to difference between the code value corresponding to the measured value and the code value corresponding to the first target value. When the target resistance value is a second target value, the resistance value measuring circuit 112 may detect that the measured value is greater than the second target value and may provide the shifting control circuit 113 with a result of the detection. The shifting control circuit 113 may generate the direction control signal SD and the code value control signal SC for increasing the code value of the calibration code. In order to increase the code value of the calibration code, the shifting control circuit 113 may generate a positive direction control signal SD(+). For example, the positive direction control signal SD(+) may have a logic high level. In order for the measured value to become close to the second target value, the shifting control circuit 113 may generate the code value control signal SC corresponding to difference between the code value corresponding to the measured value and the code value corresponding to the second target value. The calibration circuit 300 may receive the direction control signal SD and the code value control signal SC through the second signal transmission line 132 and may shift the calibration code to generate the shifted calibration code.

Ideally, the resistance value may linearly change according to variation of the code value. However, actually, the resistance value may discretely change according to the variation of the code value. Therefore, it may be hard to set the resistance value to a target value by utilizing the calibration code, which has a digital value. As illustrated in FIG. 8, when it is hard to set the resistance value to the target value by utilizing the code value, the semiconductor apparatus 120 may operate in the averaging mode. When the target value is greater than the resistance value, which is set on the basis of the calibration code CAL<1:n>, the shifting control circuit 113 may generate the direction control signal SD and the code value control signal SC for increasing the code value of the calibration code CAL<1:n>. When the target value is greater than the measured value but smaller than a higher-level value of the measured value, the shifting control circuit 113 may generate the direction control signal SD and the code value control signal SC such that the calibration code CAL<1:n> is shifted and thus the resistance value, which is set on the basis of the shifted calibration code SCAL<1:n>, corresponds to the higher-level value. In the averaging mode, the shifting control circuit 113 may generate the first selection signal SEL1 having a logic high level and the second selection signal SEL2 having a logic low level. On the contrary, the shifting control circuit 113 may generate the first selection signal SEL1 having a logic low level and the second selection signal SEL2 having a logic high level. The code selecting circuit 330 may output the shifted calibration code as the first selection calibration code and may output the calibration code as the second selection calibration code. The main driver 600 may receive the first selection calibration code and the second selection calibration code. The resistance value of the main driver 600 may be set on the basis of the calibration code and the shifted calibration code. Therefore, the resistance value of the main driver 600 may be set to the target value between the measured value and the high-level value of the measured value.

While certain embodiments have been described above, it will be understood to those skilled in the art that the embodiments described are by way of example only. Accordingly, the semiconductor apparatus performing calibration operation and the semiconductor system using the same should not be limited based on the described embodiments. Rather, the semiconductor apparatus performing calibration operation and the semiconductor system using the same described herein should only be limited in light of the claims that follow when taken in conjunction with the above description and accompanying drawings.

What is claimed is:
1. A semiconductor apparatus comprising:
 a calibration code generating circuit coupled to an external reference resistance and configured to perform a calibration operation to generate a calibration code;
 a code shifting circuit configured to change, based on a shifting control signal, a value of the calibration code to generate a shifted calibration code;
 a code selecting circuit configured to output one of the calibration code and the shifted calibration code as a first selection calibration code according to the operation mode, and output one of the calibration code and the shifted calibration code as a second selection calibration code according to the operation mode; and
 a main driver, of which a resistance value is set on the basis of the first selection calibration code and the second selection calibration code.

2. The semiconductor apparatus of claim 1, wherein the calibration code generating circuit includes:
 a reference resistance leg coupled to the external reference resistance and configured to generate a calibration voltage based on the calibration code;
 a comparator configured to compare the calibration voltage with a reference voltage to generate a comparison signal; and
 a code generator configured to generate the calibration code based on the comparison signal.

3. The semiconductor apparatus of claim 1,
 wherein the shifting control signal includes a direction control signal and a code value control signal, and
 wherein the code shifting circuit is configured to increase or decrease, based on the direction control signal, a code value of the calibration code by an amount specified by the code value control signal to generate the shifted calibration code.

4. The semiconductor apparatus of claim 1,
 wherein the code selecting circuit is configured to output the calibration code as the first selection calibration code and the second selection calibration code in a first operation mode,
 wherein the code selecting circuit is configured to output the calibration code as one of the first selection calibration code and the second selection calibration code and configured to output the shifted calibration code as one of the first selection calibration code and the second selection calibration code depending on which of the first selection calibration code and the second selection calibration code was used to output the calibration code, in a second operation mode, and wherein the code selecting circuit is configured to output the shifted calibration code as the first selection calibration code and the second selection calibration code in a third operation mode.

5. The semiconductor apparatus of claim 1,
wherein the code selecting circuit is configured to receive a first selection signal and a second selection signal according to the operation mode, and
wherein the code selecting circuit includes:
a first selection circuit configured to output one of the calibration code and the shifted calibration code as the first selection calibration code based on the first selection signal; and
a second selection circuit configured to output one of the calibration code and the shifted calibration code as the second selection calibration code based on the second selection signal.

6. The semiconductor apparatus of claim 1,
wherein the main driver includes a plurality of drivers,
wherein each of the plurality of drivers includes first and second transistors coupled to each other in parallel,
wherein the first transistors of the plurality of drivers receive the first selection calibration code, and
wherein the second transistors of the plurality of drivers receive the second selection calibration code.

7. A semiconductor apparatus comprising:
a calibration code generating circuit coupled to an external reference resistance and configured to perform a calibration operation to generate a pull-up calibration code and a pull-down calibration code;
a code shifting circuit configured to change, based on a shifting control signal, values of the pull-up calibration code and the pull-down calibration code to generate a shifted pull-up calibration code and a shifted pull-down calibration code;
a first code selecting circuit configured to output one of the pull-up calibration code and the shifted pull-up calibration code as a first selection pull-up calibration code and configured to output one of the pull-up calibration code and the shifted pull-up calibration code as a second selection pull-up calibration code, according to an operation mode;
a second code selecting circuit configured to output one of the pull-down calibration code and the shifted pull-down calibration code as a first selection pull-down calibration code and configured to output one of the pull-down calibration code and the shifted pull-down calibration code as a second selection pull-down calibration code, according to the operation mode; and
a main driver, of which a pull-up resistance value is set on the basis of the first selection pull-up calibration code and the second selection pull-up calibration code and a pull-down resistance value is set on the basis of the first selection pull-down calibration code and the second selection pull-down calibration code.

8. The semiconductor apparatus of claim 7, wherein the calibration code generating circuit includes:
a reference resistance leg coupled to the external reference resistance and configured to generate a first calibration voltage based on the pull-up calibration code;
a first comparator configured to compare the first calibration voltage with a first reference voltage to generate a first comparison signal; and
a pull-up code generator configured to generate the pull-up calibration code based on the first comparison signal.

9. The semiconductor apparatus of claim 8, wherein the calibration code generating circuit further includes:
a pull-up resistance leg, of which a resistance value is set on the basis of the pull-up calibration code;
a pull-down resistance leg, of which a resistance value is set on the basis of the pull-down calibration code, and coupled to the pull-up resistance leg and configured to generate a second calibration voltage;
a second comparator configured to compare the second calibration voltage with a second reference voltage to generate a second comparison signal; and
a pull-down code generator configured to generate the pull-down calibration code based on the second comparison signal.

10. The semiconductor apparatus of claim 7,
wherein the shifting control signal includes a direction control signal and a code value control signal, and
wherein the code shifting circuit is configured to increase or decrease, based on the direction control signal, code values of the pull-up calibration code and the pull-down calibration code by an amount specified by the code value control signal to generate the shifted pull-up calibration code and the shifted pull-down calibration code, respectively.

11. The semiconductor apparatus of claim 7,
wherein the first code selecting circuit is configured to output the pull-up calibration code as the first selection pull-up calibration code and the second selection pull-up calibration code in a first operation mode,
wherein the first code selecting circuit is configured to output the pull-up calibration code as one of the first selection pull-up calibration code and the second selection pull-up calibration code and configured to output the shifted pull-up calibration code as one of the first selection pull-up calibration code and the second selection pull-up calibration code depending on which of the first selection pull-up calibration code and the second selection pull-up calibration code was used to output the pull-up calibration code, in a second operation mode, and
wherein the first code selecting circuit is configured to output the shifted pull-up calibration code as the first selection pull-up calibration code and the second selection pull-up calibration code in a third operation mode.

12. The semiconductor apparatus of claim 11,
wherein the second code selecting circuit is configured to output the pull-down calibration code as the first selection pull-down calibration code and the second selection pull-down calibration code in the first operation mode,
wherein the second code selecting circuit is configured to output the pull-down calibration code as one of the first selection pull-down calibration code and the second selection pull-down calibration code and configured to output the shifted pull-down calibration code as one of the first selection pull-down calibration code and the second selection pull-down calibration code depending on which of the first selection pull-down calibration code and the second selection pull-down calibration code was used to output the pull-down calibration code, in the second operation mode, and
wherein the second code selecting circuit is configured to output the shifted pull-down calibration code as the first selection pull-down calibration code and the second selection pull-down calibration code in the third operation mode.

13. The semiconductor apparatus of claim 7,
wherein the first code selecting circuit is configured to receive a first selection signal and a second selection signal according to the operation mode, and
wherein the first code selecting circuit includes:
a first selection circuit configured to output, as the first selection pull-up calibration code, one of the pull-up calibration code and the shifted pull-up calibration code based on the first selection signal; and
a second selection circuit configured to output, as the second selection pull-up calibration code, one of the pull-up calibration code and the shifted pull-up calibration code based on the second selection signal.

14. The semiconductor apparatus of claim 7,
wherein the second code selecting circuit is configured to receive a first selection signal and a second selection signal according to the operation mode, and
wherein the second code selecting circuit includes:
a first selection circuit configured to output, as the first selection pull-down calibration code, one of the pull-down calibration code and the shifted pull-down calibration code based on the first selection signal; and
a second selection circuit configured to output, as the second selection pull-down calibration code, one of the pull-down calibration code and the shifted pull-down calibration code based on the second selection signal.

15. The semiconductor apparatus of claim 7,
wherein the main driver includes a plurality of pull-up drivers and a plurality of pull-down drivers,
wherein each of the plurality of pull-up drivers includes first and second pull-up transistors coupled to each other in parallel and each of the plurality of pull-down drivers includes first and second pull-down transistors coupled to each other in parallel, the first and second pull-up transistors being serially coupled to the first and second pull-down transistors,
wherein the first pull-up transistors of the plurality of pull-up drivers receive the first selection pull-up calibration code and the second pull-up transistors of the plurality of pull-up drivers receive the second selection pull-up calibration code, and
wherein the first pull-down transistors of the plurality of pull-down drivers receive the first selection pull-down calibration code and the second pull-down transistors of the plurality of pull-down drivers receive the second selection pull-down calibration code.

16. A semiconductor system comprising:
a semiconductor apparatus including:
a calibration code generating circuit coupled to an external reference resistance and configured to perform a calibration operation to generate a calibration code;
a code shifting circuit configured to change, based on a shifting control signal, a value of the calibration code to generate a shifted calibration code; and
a main driver, of which a resistance value is set on the basis of the calibration code and the shifted calibration code; and an external apparatus configured to generate the shifting control signal based on the resistance value of the main driver.

17. The semiconductor system of claim 16, wherein the calibration code generating circuit includes:
a reference resistance leg coupled to the external reference resistance and configured to generate a calibration voltage based on the calibration code;
a comparator configured to compare the calibration voltage with a reference voltage to generate a comparison signal; and
a code generator configured to generate the calibration code based on the comparison signal.

18. The semiconductor system of claim 16,
wherein the external apparatus is configured to compare the resistance value of the main driver with a target resistance value to generate a direction control signal and a code value control signal, and
wherein the code shifting circuit is configured to increase or decrease, based on the direction control signal, a code value of the calibration code by an amount specified by the code value control signal to generate the shifted calibration code.

19. The semiconductor system of claim 16,
wherein the main driver includes a plurality of drivers,
wherein each of the plurality of drivers includes first and second transistors coupled to each other in parallel,
wherein resistance values of the first transistors of the plurality of drivers are set on the basis of the calibration code, and
wherein resistance values of the second transistors of the plurality of drivers are set on the basis of the shifted calibration code.

20. The semiconductor system of claim 16,
wherein the semiconductor apparatus is further includes a first code selecting circuit configured to output one of the calibration code and the shifted calibration code as a first selection calibration code and configured to output one of the calibration code and the shifted calibration code as a second selection calibration code, according to an operation mode
wherein the resistance value of the main driver is set on the basis of the first selection calibration code and the second selection calibration code.

21. The semiconductor system of claim 20,
wherein the external apparatus is configured to provide the semiconductor apparatus with a first selection signal and a second selection signal according to the operation mode, and
wherein the first code selecting circuit includes:
a first selection circuit configured to output one of the calibration code and the shifted calibration code as the first selection calibration code based on the first selection signal; and
a second selection circuit configured to output one of the calibration code and the shifted calibration code as the second selection calibration code based on the second selection signal.

* * * * *